United States Patent
Tan et al.

(10) Patent No.: US 12,046,501 B2
(45) Date of Patent: Jul. 23, 2024

(54) SUBSTRATE HANDLING APPARATUS AND METHOD OF HANDLING SUBSTRATE

(71) Applicants: KAWASAKI JUKOGYO KABUSHIKI KAISHA, Kobe (JP); Kawasaki Robotics (USA), INC., Wixom, MI (US)

(72) Inventors: Haruhiko Tan, Kobe (JP); Simon Jeyapalan, Newark, CA (US); Avish Ashok Bharwani, Santa Clara, CA (US); Mu-Kai Lin, Santa Clara, CA (US)

(73) Assignees: KAWASAKI JUKOGYO KABUSHIKI KAISHA, Kobe (JP); KAWASAKI ROBOTICS (USA), INC.

( * ) Notice: Subject to any disclaimer, the term of this patent is extended or adjusted under 35 U.S.C. 154(b) by 0 days.

(21) Appl. No.: 17/938,336

(22) Filed: Oct. 6, 2022

(65) Prior Publication Data
US 2024/0120227 A1 Apr. 11, 2024

(51) Int. Cl.
| | | |
|---|---|---|
| H01L 21/68 | (2006.01) | |
| B25J 11/00 | (2006.01) | |
| H01L 21/67 | (2006.01) | |
| H01L 21/677 | (2006.01) | |
| H01L 21/683 | (2006.01) | |
| H01L 21/687 | (2006.01) | |

(52) U.S. Cl.
CPC ......... *H01L 21/681* (2013.01); *B25J 11/0095* (2013.01); *H01L 21/67265* (2013.01); *H01L 21/67766* (2013.01); *H01L 21/6838* (2013.01); *H01L 21/68707* (2013.01)

(58) Field of Classification Search
CPC ......... H01L 21/68707; H01L 21/67766; H01L 21/67742
See application file for complete search history.

(56) References Cited

U.S. PATENT DOCUMENTS

| | | | |
|---|---|---|---|
| 6,215,897 B1 | 4/2001 | Beer et al. | |
| 8,746,631 B2 | 6/2014 | Hashimoto et al. | |
| 8,958,907 B2 * | 2/2015 | Saeki | H01L 21/681 |
| | | | 414/744.1 |

(Continued)

FOREIGN PATENT DOCUMENTS

| | | |
|---|---|---|
| CN | 104733355 A | 6/2015 |
| CN | 107408525 A | 11/2017 |

(Continued)

OTHER PUBLICATIONS

Oxford English Dictionary, "disc | disk", Revised 2013, https://www.oed.com/dictionary/disc_n?tab=meaning_and_use&tl=true&show-all-quotations=true#6673809, accessed Dec. 20, 2023 (Year: 2013).*

*Primary Examiner* — Gerald McClain
(74) *Attorney, Agent, or Firm* — METROLEX IP LAW GROUP, PLLC

(57) ABSTRACT

A substrate handling apparatus according to one or more embodiments may include: a base, an elevating unit that is connected to the base to freely elevate and lower, an arm that is rotatably connected to the elevating unit, a disk that is provided on the arm, and a hand that is rotatably connected to the arm, wherein in case that the hand is provided on a position to overlap the arm, the disk is provided under the substrate extracted by the hand.

14 Claims, 11 Drawing Sheets

(56) References Cited

U.S. PATENT DOCUMENTS

| | | | |
|---|---|---|---|
| 9,761,478 B2* | 9/2017 | Caveney | H01L 21/68707 |
| 10,083,851 B2 | 9/2018 | Inada et al. | |
| 11,127,614 B2* | 9/2021 | Kawabe | H01L 21/681 |
| 2007/0159615 A1* | 7/2007 | Horiuchi | H01L 21/67248 |
| | | | 355/75 |
| 2008/0077271 A1 | 3/2008 | Sundar | |
| 2010/0172720 A1* | 7/2010 | Kondoh | H01L 21/67766 |
| | | | 414/217 |
| 2015/0253258 A1 | 9/2015 | Shimada et al. | |
| 2015/0287625 A1* | 10/2015 | Fujimoto | H01L 21/67253 |
| | | | 382/151 |
| 2016/0218031 A1 | 7/2016 | Inada et al. | |
| 2017/0178938 A1 | 6/2017 | Minami et al. | |
| 2018/0019154 A1* | 1/2018 | Yoshida | H01L 21/681 |
| 2019/0105770 A1* | 4/2019 | Plaisted | B25J 9/1615 |
| 2019/0355604 A1 | 11/2019 | Kawabe | |
| 2020/0070349 A1* | 3/2020 | Yoshida | B25J 9/1612 |
| 2020/0176299 A1 | 6/2020 | Chang et al. | |
| 2021/0043484 A1* | 2/2021 | Moura | B25J 9/1692 |
| 2021/0074566 A1 | 3/2021 | Rogers et al. | |
| 2021/0257242 A1 | 8/2021 | Yoshida et al. | |
| 2023/0084162 A1* | 3/2023 | Jung | B25J 11/0095 |
| | | | 700/259 |

FOREIGN PATENT DOCUMENTS

| | | |
|---|---|---|
| EP | 3300840 A1 | 4/2018 |
| JP | H10-329064 A | 12/1998 |
| JP | 2002-516238 A | 6/2002 |
| JP | 4356579 B2 | 11/2009 |
| JP | 4816280 B2 | 11/2011 |
| JP | 5229415 B2 | 7/2013 |
| JP | 5402042 B2 | 1/2014 |
| JP | 5418640 B2 | 2/2014 |
| JP | 5491731 B2 | 5/2014 |
| JP | 2015-51488 A | 3/2015 |
| JP | 6113742 B2 | 4/2017 |
| JP | 6296164 B2 | 3/2018 |
| JP | 6348789 B2 | 6/2018 |
| JP | 6377918 B2 | 8/2018 |
| JP | 2020-088259 A | 6/2020 |
| JP | 2021-044548 A | 3/2021 |
| JP | 7008573 B2 | 1/2022 |

* cited by examiner

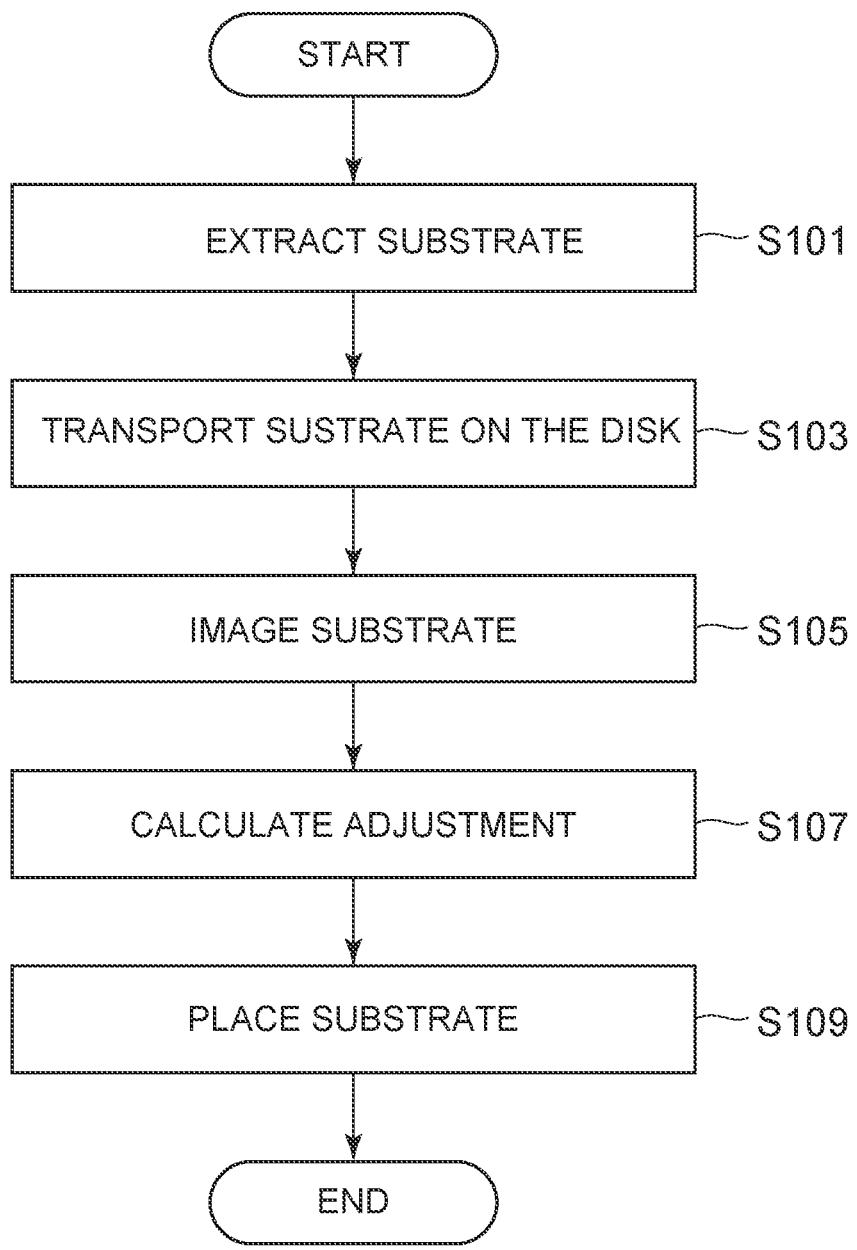

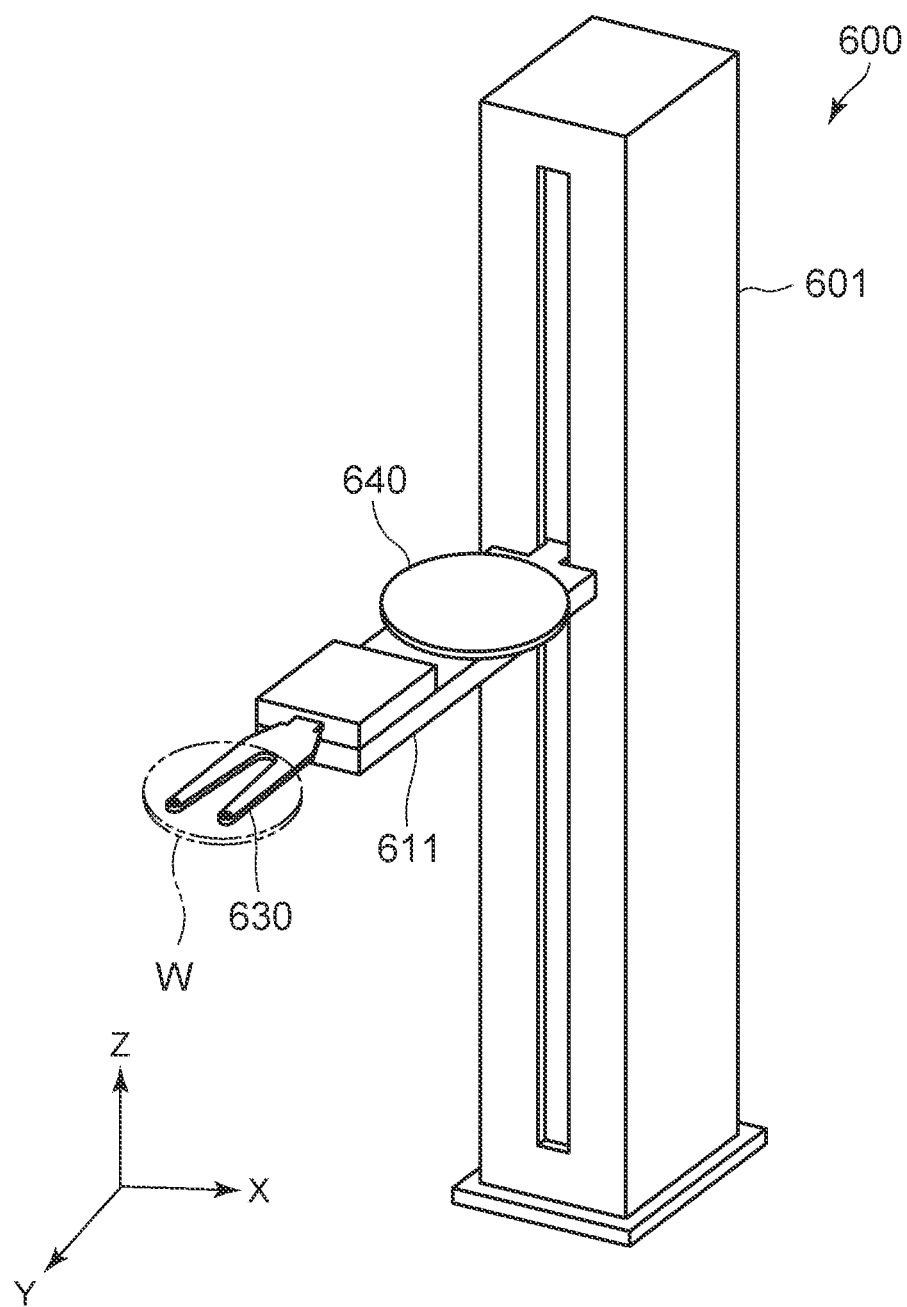

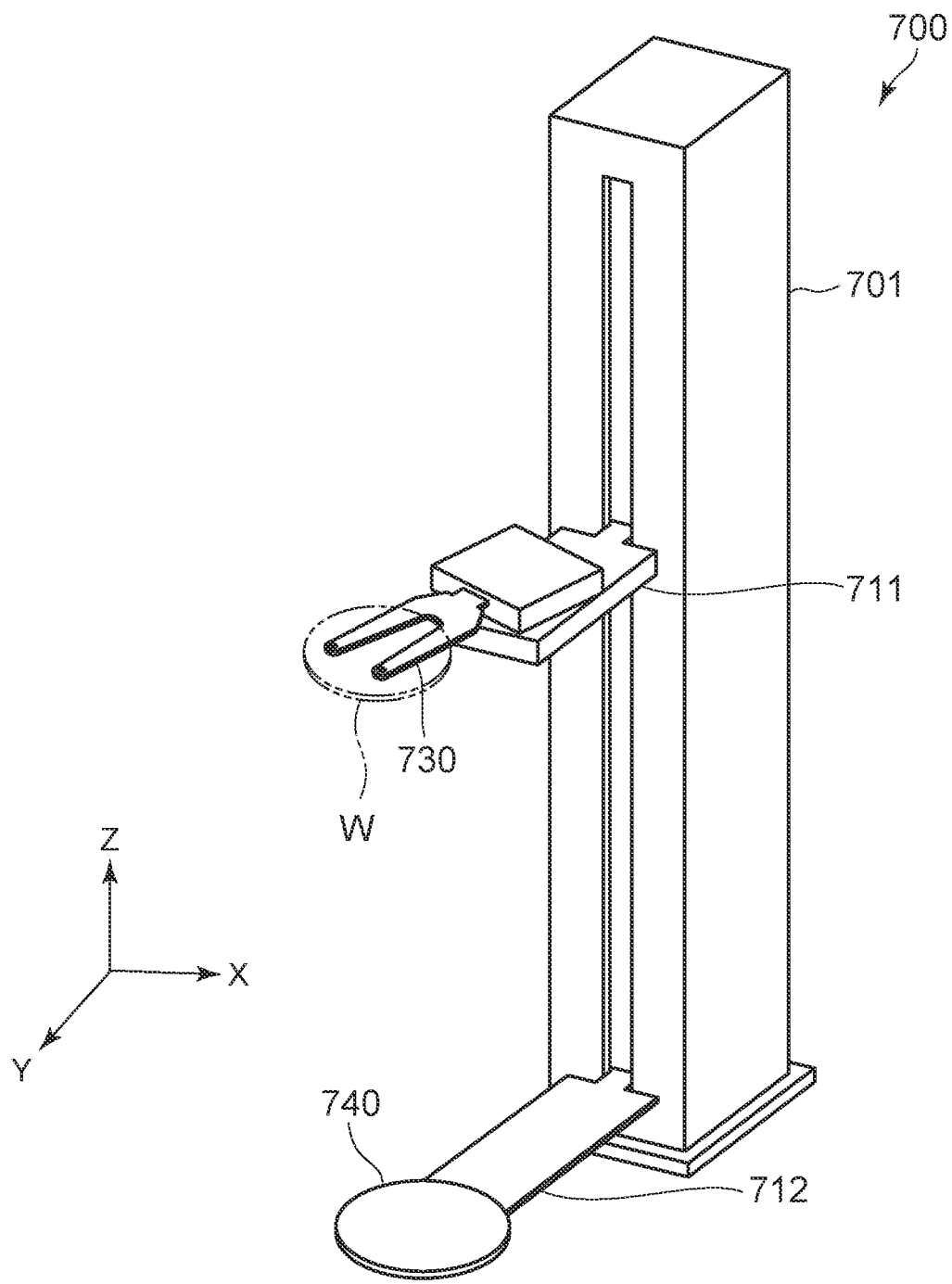

SUBSTRATE HANDLING APPARATUS AND METHOD OF HANDLING SUBSTRATE

BACKGROUND

The present disclosure relates to a semiconductor manufacturing device, and in particular to a substrate handling device and a substrate handling method of handling a substrate including a semiconductor wafer and a liquid crystal substrate.

In manufacturing a semiconductor device and a liquid crystal device, multiple manufacturing devices including a device that performs process processing, such as device formation on a substrate, etc., and a substrate inspection device are used. Substrate handling apparatus are used to transport a semiconductor wafer and a liquid crystal substrate between these manufacturing devices. The substrate handling apparatus includes an industrial robot, in particular, an industrial robot used in a clean room where a semiconductor manufacturing device is installed is called a clean robot. The clean robot takes out a substrate from a FOUP (Front Opening Unified Pod) on which multiple substrates are mounted, and transports the substrate to a predetermined position in a substrate storage included in the manufacturing device in the next process. During this transport, in order to recognize the position and orientation of the substrate, the substrate may be photographed by an imaging device such as a camera, etc. The substrate handling apparatus adjusts the position and orientation of the substrate based on an image of the imaging device and transports the substrate to the semiconductor manufacturing device in the next process.

Japanese Published Unexamined Patent Application JP-H10-329064 (Iwata) discloses a technology that transports a liquid crystal glass substrate by an industrial robot and recognizes a position of the liquid crystal glass substrate by a non-contact method using a corresponding plurality of cameras. In the above document, Iwata discloses an industrial robot that transports a liquid crystal glass substrate and places the liquid crystal glass substrate on a position of a substrate holder, an upper illuminator and a plurality of fixed substrate holder cameras provided at positions above the substrate holder at sign recognition locations to recognize positioning signs provided on the substrate holder, a plurality of fixed liquid crystal glass substrate cameras provided at positions above the liquid crystal glass substrate at position recognition locations to recognize a position of the liquid crystal glass substrate and lower illuminators provided below the liquid crystal glass substrate, and a control unit that commands a grip position recognition of the liquid crystal glass substrate when the industrial robot grips the liquid crystal glass substrate and commands the industrial robot an action to correct the difference between a grip position recognition result and a positioning sign recognition location of the substrate holder.

SUMMARY

A substrate handling apparatus according to one or more embodiments may include: a base; an elevating unit that is connected to the base to freely elevate and lower; a hand unit that is movably connected to the elevating unit and to obtain the substrate; and a disk that is provided on a position where the hand is able to move the substrate.

A substrate handling method may include: extracting a substrate; transporting the extracted substrate onto a disk; capturing an image of the substrate with a camera; calculating a position of the substrate based on the captured image; and placing the substrate based on the calculated correction amount.

BRIEF DESCRIPTION OF DRAWINGS

FIG. 4 is a diagram illustrating a flowchart of an operation of the substrate handling apparatus according to one or more embodiments;

FIG. 10 is a diagram illustrating a perspective view of a substrate handling apparatus according to one or more embodiments; and FIG. 11 is a diagram illustrating a perspective view of a substrate handling apparatus according to one or more embodiments.

DETAILED DESCRIPTION

Figure 1:
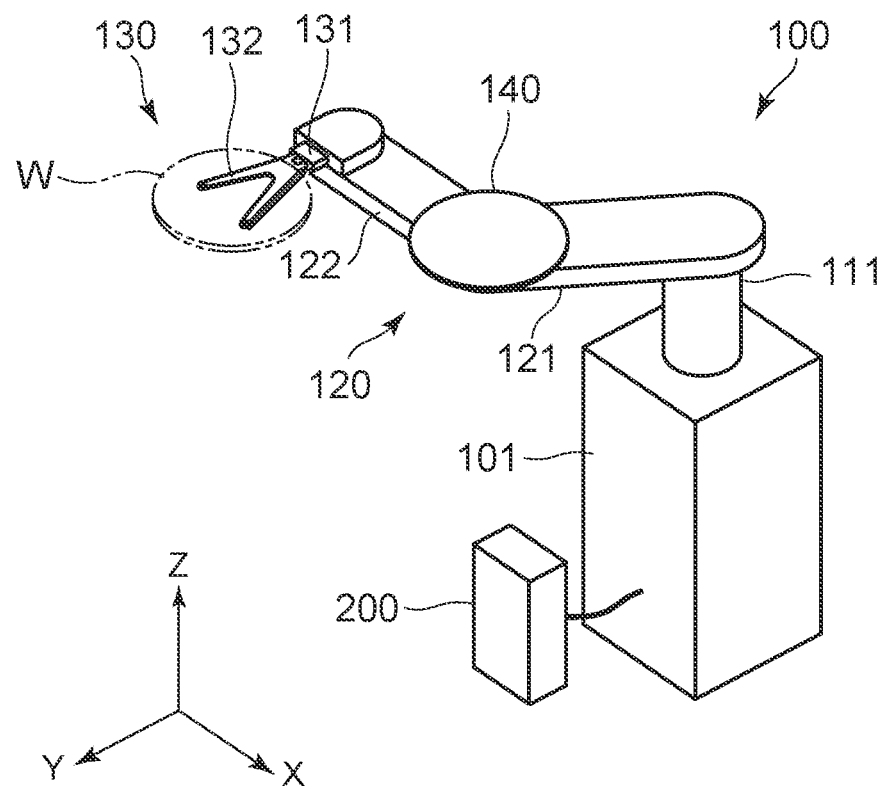
FIG. 1 is a perspective diagram illustrating a substrate handling apparatus according to one or more embodiments.

A substrate handling apparatus according to one or more embodiments is explained in detail with reference to drawings. In the description of the drawings, identical or similar portions may be indicated with identical or similar symbols. The description in the drawings is schematic, and the relationship between thickness and dimensions, and the ratio of length, thickness, etc. of each part are examples and do not limit the technical concept of the invention. The relationship between dimensions and the ratio of dimensions may differ between the drawings. In the following description, "above," "below," "right side," "left side," etc. are used as appropriate based on the orientation of the drawing to be referenced when describing the positional relationship of each component, but these indications do not limit the technical concept of the invention. Expressions such as "top," "bottom," "right side," "left side" etc. may be used even when the respective parts are not touched. "X-axis," "Y-axis," and "Z-axis" may be used in the specification or drawings to describe orientations, and "XY-surface," "YZ-surface," and "ZX-surface" may be used in the specification or the drawings to describe surfaces corresponding to the "X-axis," "Y-axis," and "Z-axis" in the drawings. "Lengthwise direction" may mean the direction of the long side in the principal surface of a member and may mean an X-direction or the opposite direction of the X-direction in the drawings. "Width direction" may mean the direction of the short side in the principal surface of the member and may mean a Y-direction or the opposite direction of the Y-direction in the drawings. "Height direction" and "Vertical direction" may mean a Z-direction or the opposite direction of the Z-direction in the drawings.

FIG. 1 is a diagram illustrating a perspective view of a substrate handling apparatus 100 according to one or more embodiments. The substrate handling apparatus 100 in FIG. 1 particularly illustrates a horizontal articulated clean robot. The substrate handling apparatus 100 includes a base 101 and a hand unit including an arm 120 and a hand 130. The base 101 supports an elevating unit 111. The base 101 is controlled to elevate and lower by a controller 200 that controls the substrate handling apparatus 100. The base 101 may be fixed to a floor surface on which the substrate handling apparatus 100 is installed or may be fixed to other semiconductor manufacturing equipment. The elevating unit 111 elevates and lowers the arm 120 in a Z-axis direction. The arm 120 is rotatably mounted to the elevating unit 111. The elevating unit 111 may be cylindrical or rectangular.

The arm 120 is movably mounted by the elevating unit 111 in a vertical direction. The arm 120 is rotatably mounted to the elevating unit 111. The arm 120 may be a horizontally articulated arm. The arm 120 includes a first arm 121 and a second arm 122.

The first arm 121 is mounted between the elevating unit 111 and the second arm 122. A first end of the first arm 121 is provided by the elevating unit 111 to be able to elevate and lower in the Z direction. The first arm 121 is rotatably mounted around the elevating unit 111 in the XY-surface illustrated in the figure. At a second end of the first arm 121, the second arm 122 is rotatably mounted. A rotation axis of the arm 120 may be provided around the center of a cross-section of the XY-surface of the elevating unit 111.

The second arm 122 is mounted between the first arm 121 and the hand 130. A first end of the second arm 122 is rotatably mounted to the first arm 121 in the XY-surface illustrated in the figure. At a second end of the second arm 122, the hand 130 is rotatably mounted.

The hand 130 includes a wrist 131 and a fork 132 and is rotatably mounted to the second arm 122 via the wrist 131. The wrist 131 is rotatably mounted to the second end of the second arm 122 in the XY-surface. The hand 130 extracts a substrate W from a FOUP (Front Opening Unified Pod) on which a plurality of wafers, etc. are mounted, using the fork 132. Then, the hand 130 transports the extracted substrate W to a predetermined position in a substrate storage included in the manufacturing device.

The hand 130 illustrated in FIG. 1 is a vacuum hand type, and the fork 132 of the hand 130 has a branch structure and has a suction unit at its tips. The fork 132 sanctions the surface of the substrate W under negative pressure and transports the substrate W. The suction type hand includes, for example, a Bernoulli chuck.

The hand 130 is not limited to a vacuum hand type and may be a passive grip type or an edge grip type. The passive grip type hand is a grip that does not fix a substrate placed on the hand and may not have a pressing member. The edge grip type has an edge guide at each fork split end. A pressing member is provided near the wrist. The pressing member can slide along the surface of the hand by an actuator including a pneumatic cylinder. By sliding the pressing member while a substrate is placed on the fork, the substrate is held between the edge guide and the pressing member. In any configuration, the hand 130 has a configuration to support the substrate W and transport the substrate W.

Each of the elevating unit 111, the first arm 121, the second arm 122, and the hand 130 may be driven by the controller 200. Each of the elevating unit 111, the first arm 121, the second arm 122, and the hand 130 may be driven by an actuator not illustrated in the figure. The actuator not illustrated in the figure may include, for example, an electric motor. At arm joints located between the elevating unit 111 and the first arm 121, between the first arm 121 and the second arm 122, and between the second arm 122 and the hand 130, an encoder (not illustrated in the figure) may be mounted to detect a rotational position of each of the first arm 121, the second arm 122, and the hand 130. Also, in the substrate handling apparatus 100, an encoder (not illustrated in the figure) may be provided to detect a position change of the first arm 121 in a height direction, for example, the amount of elevation of the first arm 121 of the elevating unit 111. In this way, each joint of the arm 120 and the hand 130 is controlled to transport the substrate W.

The controller 200 is connected to the base 101 and performs various controls including an arm position control of the substrate handling apparatus 100. The controller 200 controls operations of the actuators that drive each of the elevating unit 111, the first arm 121, the second arm 122, and the hand 130. The controls of these actuators may be performed based on position information including the rotational position or height position of the first arm 121, the second arm 122, or the hand 130 detected by the encoder (not illustrated in the figure). Although the controller 200 is a separate housing from the base 101, the controller 200 and the base 101 may be in one housing. Also, the controller 200 is only required to be able to perform various controls of the substrate handling apparatus 100 and can perform controls by being connected to the substrate handling apparatus 100 by a wired connection or a wireless connection. The controller 200 does not need to be located near the substrate handling apparatus 100 and, for example, can be connected via the Internet to perform various controls of the substrate handling apparatus 100.

The controller 200 may be, for example, a computer including a CPU (Central Processing Unit), and the computer reads a computer program stored in a storage medium and performs various controls of the substrate handling apparatus 100. The storage medium may be a non-transitory computer-readable storage medium, such as a ROM (Read Only Memory), etc., a tape, disk, card, semiconductor memory, programmable logic circuit, etc. may be used. Also, the computer may further be provided with a RAM (Random Access Memory), etc. to expand the above program. In addition, the above program may be supplied to the above computer via an optional transmission medium (a communication network, broadcast wave, etc.) capable of transmitting the program. Furthermore, the above program may be realized in the form of a data signal embedded in a carrier wave, in which the above program is embodied by electronic transmission.

The substrate handling apparatus 100 includes a disk 140. The disk 140 is provided above a first end of the second arm 122. Considering the handling of the hand 130, the disk 140 may be provided at a predetermined interval from the rotation axis of the hand 130 (not illustrated in the figure). The hand 130 takes out the substrate W and moves the substrate W to the upper side of the disk 140. The hand 130, after taking out the substrate W, rotates and moves in the XY-surface illustrated in the figure and moves substantially parallel to the second arm 122. When the substrate W is moved onto the first end of the second arm 122, the disk 140 is positioned to be substantially below the substrate W in the Z-axis direction of the figure. The shape of the disk 140 illustrated in FIG. 1 is circular, but it is not limited thereto and can be implemented. The shape and dimensions of the disk 140 may be determined in consideration of the shape and dimensions of the substrate W to be transported and the environment in which the substrate handling apparatus 100 is installed. For example, the shape and dimensions of the disk 140 may be almost the same as the shape and dimensions of the substrate W to be transported. When the shape of the substrate W is substantially a circle, the disk 140 may be substantially a circle. With respect to the dimensions of the disk, the diameter may be 50 mm and over and 500 mm and under, and may be 200 mm and over and 400 mm and under. Also, depending on the size of the substrate, 500 mm and over can be implemented. For example, when the substrate W is, for example, 300 mm, the disk may be 300 mm and over. Also, the substrate handling apparatus 100 of FIG. 1 includes a two-link arm having two arms, but it is not limited thereto, and the number of arms may be one, three, four, or more. The disk may be provided at the end of the arm to which the hand is not connected. In the case of multiple arms, the arm is connected to the hand, and the disk may be provided at the end opposite the end connected to the hand in the longitudinal direction of the arm. In other words, in the case of multiple arms, the arm is connected to the hand, and the disk may be provided at the end which is not connected to the hand. Also, the disk may be provided on an arm to which the hand is not connected. For example, in the substrate handling apparatus 100 illustrated in FIG. 1, the disk 140 may be provided on the first arm 121. For example, the disk 140 may be provided near the first end of the first arm 121.

Figure 2A:
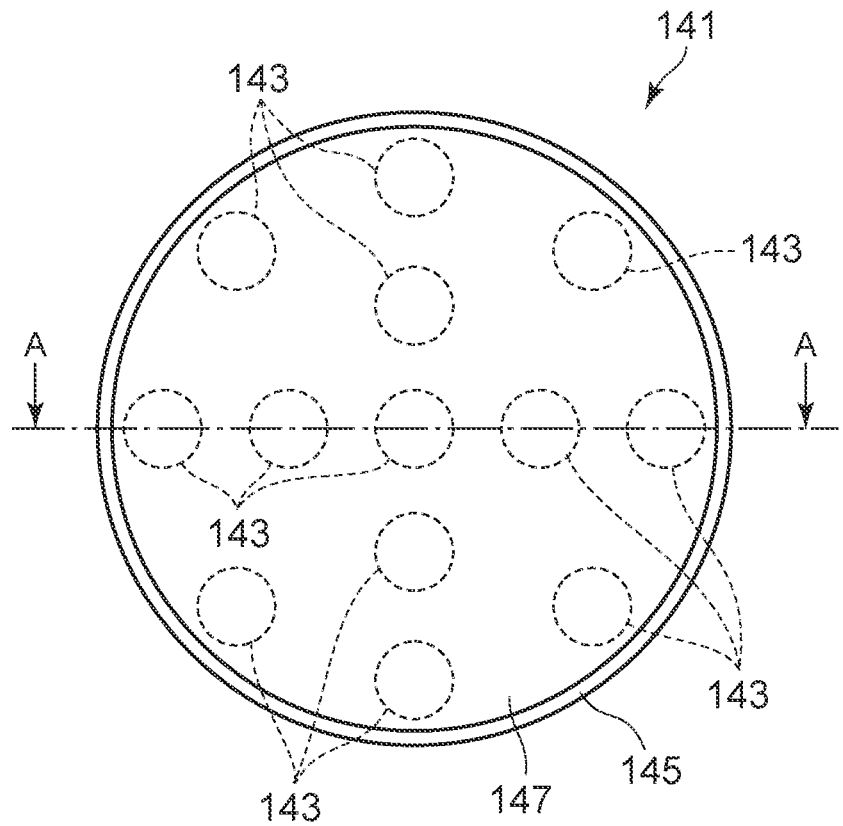
FIG. 2A is a diagram illustrating a top view of a disk according to one or more embodiments.
Figure 2B:
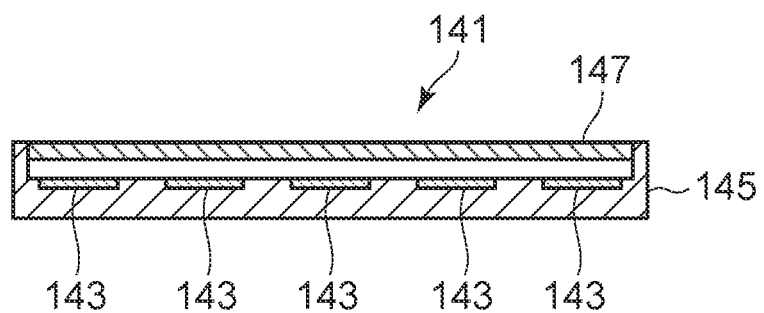
FIG. 2B is a diagram illustrating an A-A cross-sectional view of the disk illustrated such as in FIG. 2A.

FIG. 2A and FIG. 2B are diagrams each illustrating a disk according to one or more embodiments. In a disk 141 illustrated in FIG. 2A, a plurality of lights 143 are provided inside the disk 141. The plurality of lights 143 are provided on a surface of the disk 141. The plurality of lights 143 may be light emitting, for example, LED (Light emitted Diode) or fluorescent light. FIG. 2B is a diagram illustrating an A-A cross-sectional view of the disk 141. In the disk 141, the plurality of lights 143 are installed in a disk body 145. A cover 147 is provided to cover the plurality of lights 143. The cover 147 is a transparent or translucent member and transmits or partially transmits light from the lights 143. This allows light from the plurality of lights 143 to be emitted outside of the disk 141. In the embodiment of FIG. 2A, the plurality of lights 143 are small compared to the disk 141, but it is not limited thereto, and a light of approximately the same size as the disk 141 may be provided inside the disk body 145. This allows uniform light intensity to be obtained. Also, although the disk 141 is provided with the transparent or translucent cover 147, it is not limited thereto, and for example, the light may be exposed to the outside without a cover.

Figure 3A:
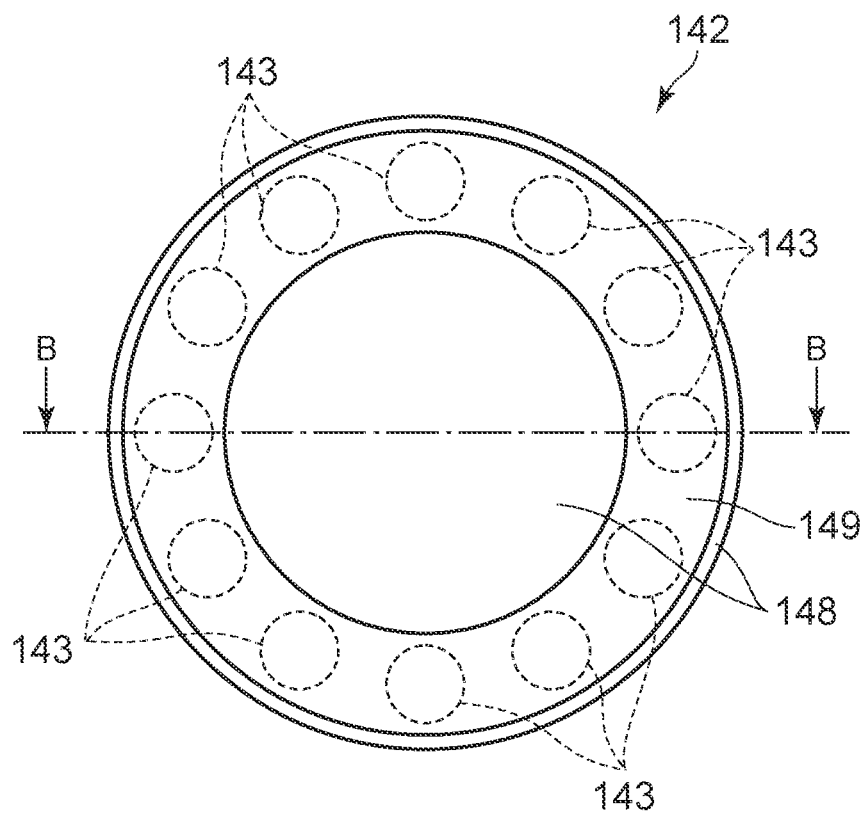
FIG. 3A is a diagram illustrating a top view of a disk according to one or more embodiments.
Figure 3B:
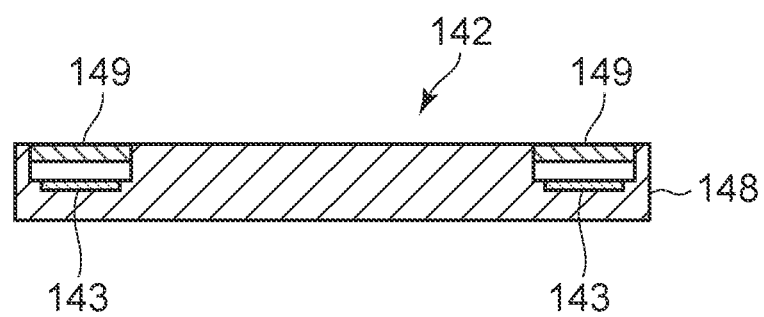
FIG. 3B is a diagram illustrating B-B cross-sectional view of the disk illustrated such as in FIG. 3A.

FIG. 3A and FIG. 3B are diagrams each illustrating a disk 142 according to one or more embodiments. In the disk 142 illustrated in FIG. 3A, the plurality of lights 143 are provided inside the disk 142. The plurality of lights 143 are provided on the surface of the disk 142 and are arranged along the periphery of the disk 142. The plurality of lights 143 may be light emitting, for example, LED (Light emitted Diode) or fluorescent light. FIG. 3B is a diagram illustrating a B-B cross-sectional view of the disk 142. In the disk 142, the plurality of lights 143 are provided on the periphery of a disk body 148. A cover 149 is provided to cover the plurality of lights 143. The cover 149 is a transparent or translucent member and transmits or partially transmits light from the lights 143. This allows the light from the light plurality of lights 143 to be emitted to the outside of the disk 142. In the embodiment of FIG. 3A, the plurality of lights 143 are small compared to the disk 142, but it is not limited thereto, and a light of approximately the same size as the disk 142 may be provided on the outer periphery of the interior of the disk body 148. This allows the outer periphery of the disk 142 to have a uniform amount of light. Also, although the disk 142 is provided with the transparent or translucent cover 149, it is not limited thereto, and for example, the light may be exposed to the outside without a cover.

Here, the lights 143 may be controlled on and off. That is, the lights 143 may be turned on only when the substrate W is moved onto the disk 140 and is imaged by the camera (not illustrated in the figure), and the lights 143 may be turned off when the camera completes capturing the image. By doing so, not only can low power consumption be achieved, but also possible degradation of the substrate due to the lights 143 may be mitigated. Also, the intensity of the light of the lights 143 may be changed. This allows the camera to obtain a clear image without being affected by the environment of the substrate handling apparatus 100. In addition, the color temperature of the lights 143 may be about from 2600K to 7100K. Amber, light bulb color, warm white, white, day white, daylight color, etc. can be selected according to the environment of the substrate handling apparatus and the characteristics of the substrate used.

Next, an operation of the substrate transport device 100 is described with reference to the drawings. FIG. 4 is a diagram illustrating a flowchart of an operation of the substrate transport device 100 according to one or more embodiments. The substrate transport device 100 first takes out a substrate from a FOUP, etc. (step S101). The fork 132 provided on the hand 130 of the substrate transport device 100 is used to take out the substrate W. Next, the removed substrate W is transported onto the disk 140 provided in the substrate transport device 100 (step S102). The disk 140 is provided on the arm 120 of the substrate transport device 100. The hand 130 that has taken out the substrate W is rotated, and the substrate W is moved onto the disk 140 provided on the arm 120 in the substrate transport device 100. Next, the substrate W is imaged by a camera (not illustrated in the figure) (step S105). During imaging, a light (not illustrated in the figure) provided on the disk 140 is turned on to illuminate the substrate W. This allows a clearer image to be obtained. The light (not illustrated in the figure) may be turned on only when imaging the substrate W and turned off at other times. This may reduce power consumption and extend the life of the light (not illustrated in the figure). Also, the possible degradation of the substrate W that may be caused by the light may be reduced. The imaging of the camera (not illustrated in the figure) may be either still or moving images. Here, a detection target by the camera (not illustrated in the figure) includes the position of the substrate W, the orientation of the substrate W, the detection of a defective substrate W, and the recognition of the type of the substrate W. Next, the position of the substrate W is calculated based on the captured image (step S107). To calculate the position of the substrate W, for example, the positions of a notch and an orientation flat of the substrate W are obtained from the captured image, and a correction amount for the position of the substrate W is calculated based on the position and orientation of the substrate W relative to the position and orientation of the fork 132. The measurement and correction of the misalignment of the substrate W is referred to with support from US Patent Publication 2021/0257242. Next, the substrate W is placed on the manufacturing device for the next process based on the calculated correction amount (step S109).

Thus, according to the substrate handling apparatus 100 according to one or more embodiments, when obtaining an image of a substrate used for correcting the position of the substrate, the substrate is transported onto a disk having a light that illuminates the substrate. Since the disk is provided on an arm of the substrate handling apparatus, the moving distance of the disk can be shortened, and the moving time of the disk can be reduced. In addition, the detection of the position and orientation of the substrate is improved because the imaging location is on the upper part of the arm.

Figure 5:
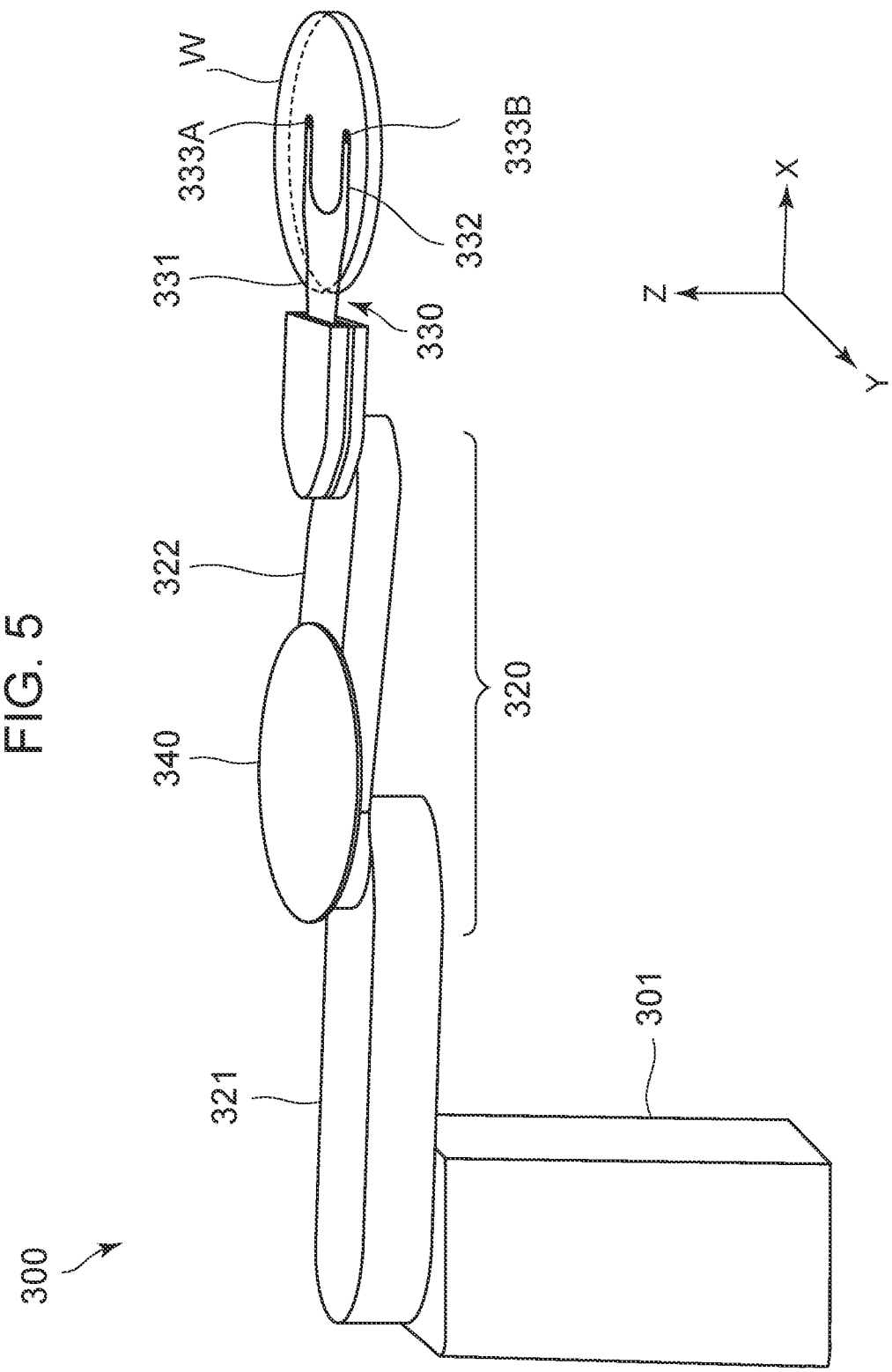
FIG. 5 is a diagram illustrating a perspective view a substrate handling apparatus according to one or more embodiments.

FIG. 5 is a diagram illustrating a perspective view of a substrate handling apparatus 300 according to one or more embodiments. The substrate handling apparatus 300 of FIG. 5 illustrates, in particular, a horizontal articulated clean robot. The substrate handling apparatus 300 includes a base 301 and a hand unit including an arm 320 and a hand 330. The substrate handling apparatus 300 may have an elevating unit. The arm 320 may be connected to be able to elevate and lower in the Z-axis direction illustrated in the figure by the elevating unit. The base 301 may be connected to a controller (not illustrated in the figure) that controls the substrate handling apparatus 300. The base 301 may be fixed to a floor surface on which the substrate handling apparatus 300 is installed, or may be fixed to other semiconductor manufacturing equipment. The elevating unit (not illustrated in the figure) elevates and lowers the arm 320 to move the arm 320 in the Z-axis direction. The arm 320 is rotatably mounted on the elevating unit (not illustrated in the figure). Here, when the substrate W does not require movement in the Z-axis direction illustrated in the figure, the elevating unit (not illustrated in the figure) is not necessary.

The arm 320 is attached to be movable in the vertical direction by the elevating unit (not illustrated in the figure). The arm 320 is rotatably mounted in the XY-surface illustrated in the figure by the elevating unit (not illustrated in the figure). The arm 320 may be a horizontally articulated arm. The arm 320 includes a first arm 321 and a second arm 322.

The hand 330 is rotatably attached to the second arm 322 via a wrist 331. The wrist 331 is rotatably attached to a second end of the second arm 322 in the XY-surface illustrated in the figure. The hand 330 takes out the substrate W, such as a wafer, etc., from the FOUP (Front Opening Unified Pod) on which a plurality of substrates is mounted, and transports the substrate W to a predetermined position in a substrate storage included in the manufacturing device. The hand 330 includes suction units 333A and 333B that suction the substrate W, the substrate W is suctioned onto a fork 332 by the suction unit, and the hand 330 includes a vacuum hand that moves the substrate. The vacuum hand can reduce the blocking of light from a disk 340 more than an edge grip hand. To reduce the light blocking, the fork 332 of the hand 330 may be equipped with a light (not illustrated in the figure). When the disk 340 is used as a backlight to illuminate the substrate W, the fork blocks the light. The light 333 is provided on the fork 332, and the light illuminates the light onto the substrate. This allows the light from the light to compensate for the light from the disk 340 even if the fork blocks the light.

The disk 340 is provided on an upper part of a first end of the second arm 322. The disk 340 may use, for example, the disk illustrated in FIG. 2A, FIG. 2B, FIG. 3A, and FIG. 3B.

Next, an operation of the substrate handling apparatus 300 is described in detail with reference to the drawings. As illustrated in FIG. 5, the substrate handling apparatus 300 first extracts the substrate W from the FOUP (not illustrated in the figure), etc. When the substrate W is extracted, the substrate handling apparatus 300 performs a position control of the hand 330 and moves the hand 330 to a predetermined position of the FOUP (not illustrated in the figure) to extract the substrate. Next, the extracted substrate W is transported onto the disk 340 provided in the substrate handling apparatus 300.

Figure 6:
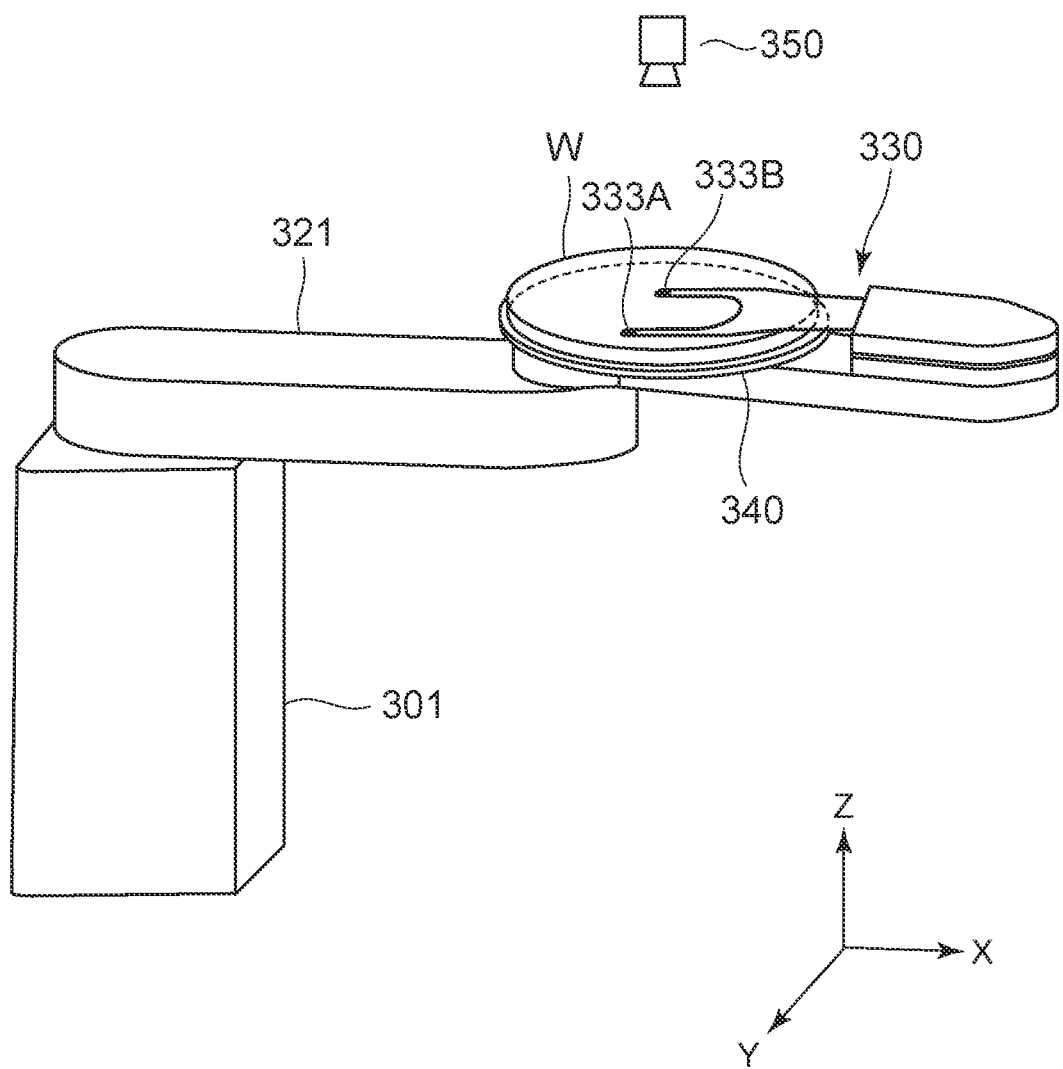
FIG. 6 is a diagram illustrating a perspective view of a state in which an extracted substrate is transported on a disk provided in the substrate handling apparatus.

FIG. 6 is a diagram illustrating perspective view of a state in which the extracted substrate W is transported on the disk 340 provided in the substrate handling apparatus 300. The hand 330 rotates in the XY-surface and moves the substrate W onto the disk 340. As illustrated in the figure, the substrate W is placed substantially above the disk 340. Next, a camera 350 is used to image the substrate W. During imaging, a light (not illustrated in the figure) provided on the disk 340 is turned on to illuminate the substrate. This allows a clearer image to be obtained. The light may be turned on only when imaging the substrate and turned off at other times. This may reduce power consumption and extend the life of the light (not illustrated in the figure). The camera 350 may capture either a still image or a video. Here, the detection target of the camera 350 includes the position of the substrate, the orientation of the substrate, the detection of the defective substrate, and the recognition of a type of the substrate. Next, the position of the substrate is calculated based on the captured image. To calculate the position of the substrate, for example, the positions of a notch or an orientation flat of the substrate are obtained from the captured image, and a correction amount of the substrate position is calculated based on the position and orientation of the substrate relative to the position and orientation of the fork. Next, the substrate is placed in the substrate storage of the manufacturing device in the next process based on the calculated correction amount. Also, the position of the camera 350 may be any position at which the substrate W can be imaged. The camera 350 may be provided above the movement range of the disk 340. By doing so, the movement of the disk can be minimized. Therefore, since the time for moving the disk can be minimized, the throughput of the substrate transport can be improved.

Figure 7:
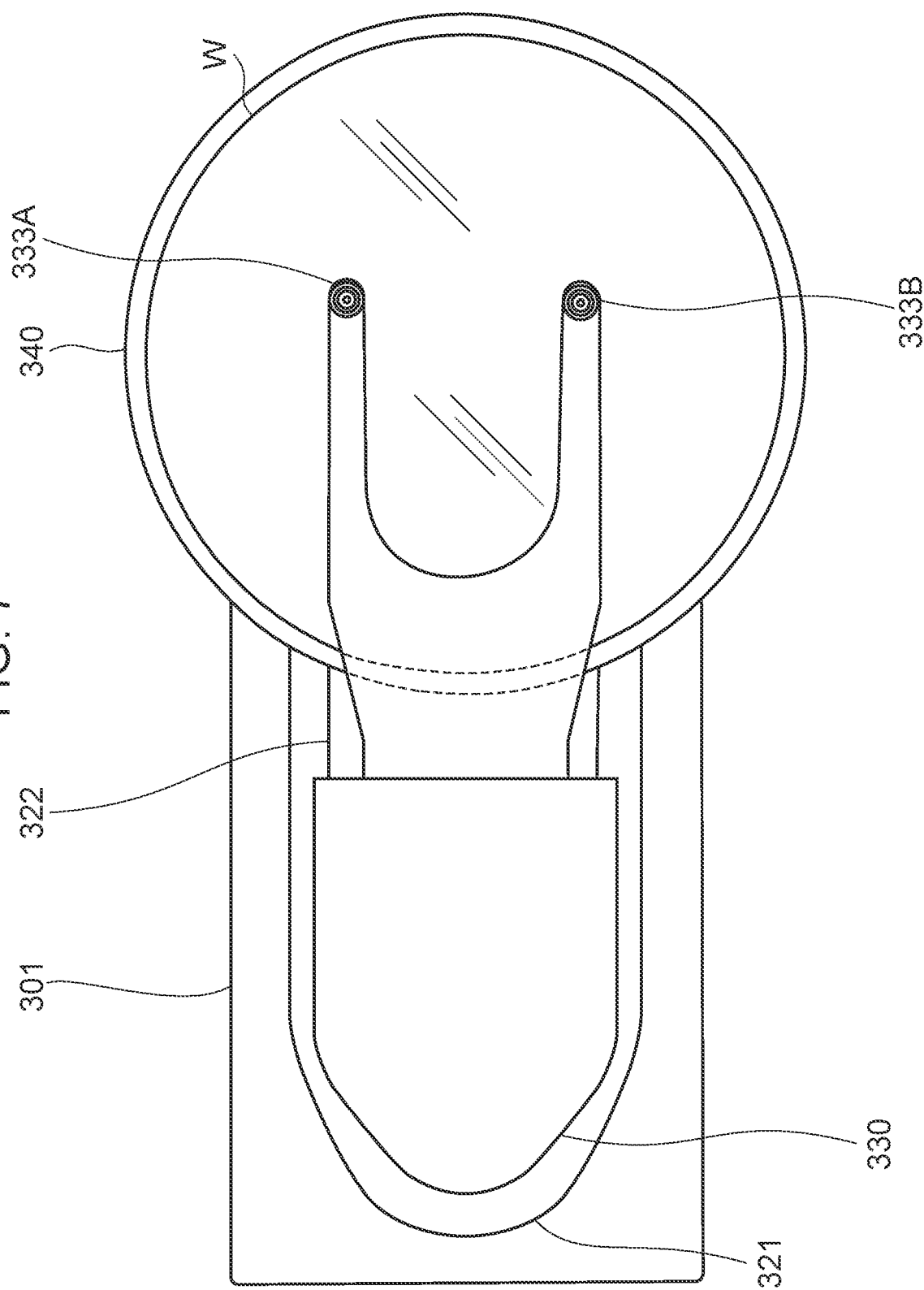
FIG. 7 is a diagram illustrating a top view of a state in which the extracted substrate is transported on a disk provided in the substrate handling apparatus.

FIG. 7 is a diagram illustrating a top view of a state in which the extracted substrate W is transported on the disk 340 provided in the substrate handling apparatus 300. The example of FIG. 6 illustrates an example that the hand 330 and the second arm 322 overlap and the substrate W is moved to the upper surface of the disk 340. The example of FIG. 7 illustrates an example that the hand 330, the second arm 322, and the first arm 321 overlap and the substrate W is moved to the upper surface of the disk 340. For example, the hand 330 rotates in the XY-surface and moves the substrate W onto the disk 340. Then, the second arm 322 moves onto the first arm 321. As illustrated in the figure, the substrate W is placed substantially above the disk 340. The light (not illustrated in the figure) of the disk 340 is turned on, and an image of the substrate W is captured by a camera (not illustrated in the figure) when the first arm 321 is in the same position. The position of the disk 340 according to the arrangement illustrated in FIG. 6 and the disk 340 illustrated in FIG. 7 are in the same position. Therefore, the degree of freedom in the arrangement of the camera is increased, and furthermore, the camera can be provided in the vicinity of the substrate handling apparatus 300. This can increase the degree of freedom of the floor plan.

According to the substrate handling apparatus according to one or more embodiments, by placing the camera 350 in a predetermined position of an upper part of the disk 340, to recognize the position and orientation of the substrate W, for example, a procedure of moving the substrate W to a station where the camera is installed becomes unnecessary. This reduces the time required to place the substrate W on the hand, recognize the position and orientation, and move the substrate W to a specified device, thus maintaining high throughput. In addition, there is no need to set up a station where a camera is installed, which can contribute to space saving. Furthermore, since there is no need to install a station, the clean room environment can be improved. Moreover, by installing a disk including a light on the arm, the degree of freedom of design improves, and the camera can be placed close to the substrate handling apparatus.

Figure 8:
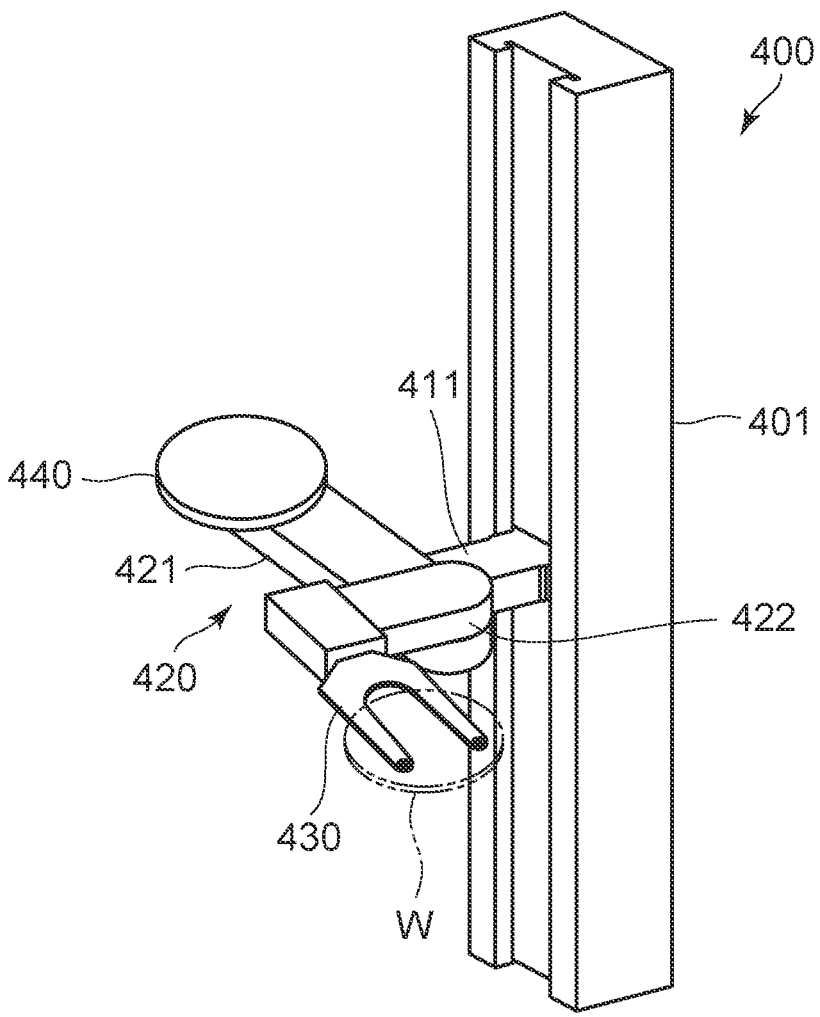
FIG. 8 is a diagram illustrating a perspective view of a substrate handling apparatus according to one or more embodiments.

FIG. 8 is a diagram illustrating a perspective view of a substrate handling apparatus 400 according to one or more embodiments. The substrate handling apparatus 400 of FIG. 8 illustrates a horizontal articulated clean robot, and in particular, illustrates a part of a clean robot whose elevating axis is a pillar type. The substrate handling apparatus 400 includes an elevating pillar 401, an elevating unit 411, and a hand unit including an arm 420 and a hand 430. The elevating pillar 401 supports the elevating unit 411 so as to be able to elevate and lower. The elevating unit 411 is controlled to elevate and lower by a controller (not illustrated in the figure) that controls the substrate handling apparatus 400. The elevating pillar 401 may be fixed to a floor surface on which the substrate handling apparatus 400 is installed, or may be fixed to other semiconductor manufacturing equipment (not illustrated in the figure). The elevating unit 411 elevates and lowers the arm 420 in the vertical direction (Z-axis direction) along a groove provided in the elevating pillar 401. The arm 420 is rotatably attached to the elevating unit 411. In consideration of the rotation of the arm 420, a rotation axis of the arm 420 (not illustrated in the figure) and the elevating pillar 401 have a predetermined distance. The elevating pillar 401 of FIG. 8 has a structure having a groove for the elevating unit 411 to move in a rectangular body, but it is not limited thereto. For example, the structure may have a groove for the elevating unit 411 to move in a cylindrical shape.

The elevating unit 411 elevates and lowers to move in the vertical direction (Z-axis direction), and the arm 420 is movably mounted vertically. The arm 420 is rotatably attached to the elevating unit 411. The arm 420 may be a horizontally articulated arm. The arm 420 includes a first arm 421 and a second arm 422. The rotation axis of the arm 420 may be provided at an approximate center of the arm 420. This avoids contact with the elevating pillar 401 due to rotational movement of the arm 420, can minimize the distance between the arm 420 and the elevating pillar 401.

The first arm 421 is mounted between the elevating unit 411 and the second arm 422. A first end of the first arm 421 is provided by the elevating unit 411 to be able to elevate and lower in the Z-direction illustrated in the figure. The first arm 421 is rotatably mounted in the XY-surface illustrated in the figure. At a second end of the first arm 421, the second arm 422 is attached.

The second arm 422 is mounted between the first arm 421 and the hand 430. A first end of the second arm 422 is rotatably attached to the first arm 421 in the XY-surface illustrated in the figure. At a second end of the second arm 422, the hand 430 is attached.

The hand 430 includes a wrist and a fork, and is rotatably attached to the second arm 422 via the wrist in the XY-surface illustrated in the figure. The wrist is rotatably attached to the second end of the second arm 422 in the XY-surface illustrated in the figure. The hand 430 obtains the substrate W from the FOUP (Front Opening Unified Pod) on which a plurality of wafers, etc. are mounted, using a fork. Then, the hand 430 transports the extracted substrate W to a predetermined position in the substrate storage included in the manufacturing device.

A fork of the hand 430 illustrated in FIG. 8 may, for example, be an edge-grip type having a branching structure as illustrated in FIG. 5. Also, the hand 430 is not limited to an edge grip type, but may be a passive grip type or a suction type. The hand 430 supports the substrate W and transports the substrate W.

Each of the elevating unit 411, the first arm 421, the second arm 422, and the hand 430 are controlled by a controller (not illustrated in the figure). Each of the elevating unit 411, the first arm 421, the second arm 422, and the hand 430 may be driven by an actuator (not illustrated in the figure). The actuator (not illustrated in the figure) may include, for example, an electric motor. At arm joints located between the elevating unit 411 and the first arm 421, between the first arm 421 and the second arm 422, and between the second arm 422 and the hand 430, an encoder (not illustrated in the figure) may be mounted to detect the rotational position of each of the first arm 421, the second arm 422, and the hand 430. Also, in the substrate handling apparatus 400, an encoder (not illustrated in the figure) may be provided to detect a change in the position of the first arm 421 in the height direction, for example, the amount of elevation of the first arm 421 of the elevating unit 411. In this way, each joint unit of the arm 420 and the hand 430 is controlled to transport the substrate.

The substrate transport device 400 includes a disk 440. The disk 440 is provided above the first end of the first arm 421. The disk 440 may be provided at a predetermined interval from the rotation axis of the second arm (not illustrated in the figure) in consideration of the handling of the arm 420 and the hand 430. The hand 430, after taking out the substrate W, rotates and moves around the rotation axis of the second end of the second arm 422 in the XY-surface illustrated in the figure, and the first arm 421 rotates in the XY-surface illustrated in the figure to place the substrate W to be substantially above the disk 440 in the Z-axis direction illustrated in the figure. The shape of the disk 440 illustrated in FIG. 8 is circular, but it is not limited thereto and may be implemented. The shape and dimensions of the disk 440 may be the same as in the aforementioned embodiments. Also, the substrate transport device 400 of FIG. 8 includes a two-link arm having two arms, but it is not limited thereto, and the number of arms may be one, three, four, or more. A disk may be provided at the end of the arm to which the hand is not connected. In the case of multiple arms, the disk may be provided on the arm connected to the hand and opposite the end connected to the hand in the longitudinal direction of the arm. In other words, in the case of multiple arms, the disk may be provided on the arm connected to the hand and at the end not connected to the hand. Also, the disk may be provided in the elevating unit.

Next, an operation of the substrate handling apparatus 400 is described. The substrate handling apparatus 400 may operate as illustrated in the flowchart of FIG. 4. That is, the substrate handling apparatus 400 first takes out the substrate W from the FOUP, etc. (step S101). The substrate W is extracted using a fork provided in the hand 430 of the substrate handling apparatus 400. Next, the extracted substrate W is transported onto the disk 440 provided in the substrate handling apparatus 400 (step S102). The disk 440 is provided on the first arm 421 of the substrate device 400. The hand 430 from which the substrate W is extracted rotates in the XY-surface illustrated in the figure, and moves the substrate W onto the disk 440, which is provided on the first arm 421. Next, the substrate W is imaged by a camera (not illustrated in the figure) (step S105). During the imaging, a light (not illustrated in the figure) provided on the disk 440 may be turned on to illuminate the substrate W. The light provided on the disk 440 and the camera may be the same as in the embodiments described above. Next, the position of the substrate W is calculated based on the captured image (step S107). To calculate the position of the substrate W, for example, the positions of a notch and orientation flat of the substrate W are obtained from the captured image, and the correction amount of the substrate position is calculated based on the position and orientation of the substrate W relative to the position and orientation of the fork. For the measurement and correction of the position misalignment of the substrate W, US Patent Publication 2021/0257242 is referred to for reference. Next, the substrate is placed on the manufacturing device for the next process based on the calculated correction amount (step S109).

Thus, according to the substrate handling apparatus 400 according to one or more embodiments, when obtaining an image of a substrate used for position correction of the substrate W, the substrate is transported onto a disk having a light that illuminates the disk. Since the disk is provided on the arm of the substrate handling apparatus, the moving distance of the disk can be shortened, and the moving time of the disk can be reduced. In addition, since the imaging location is on the upper part of the arm, the detection of the position and orientation of the substrate is improved.

Figure 9:
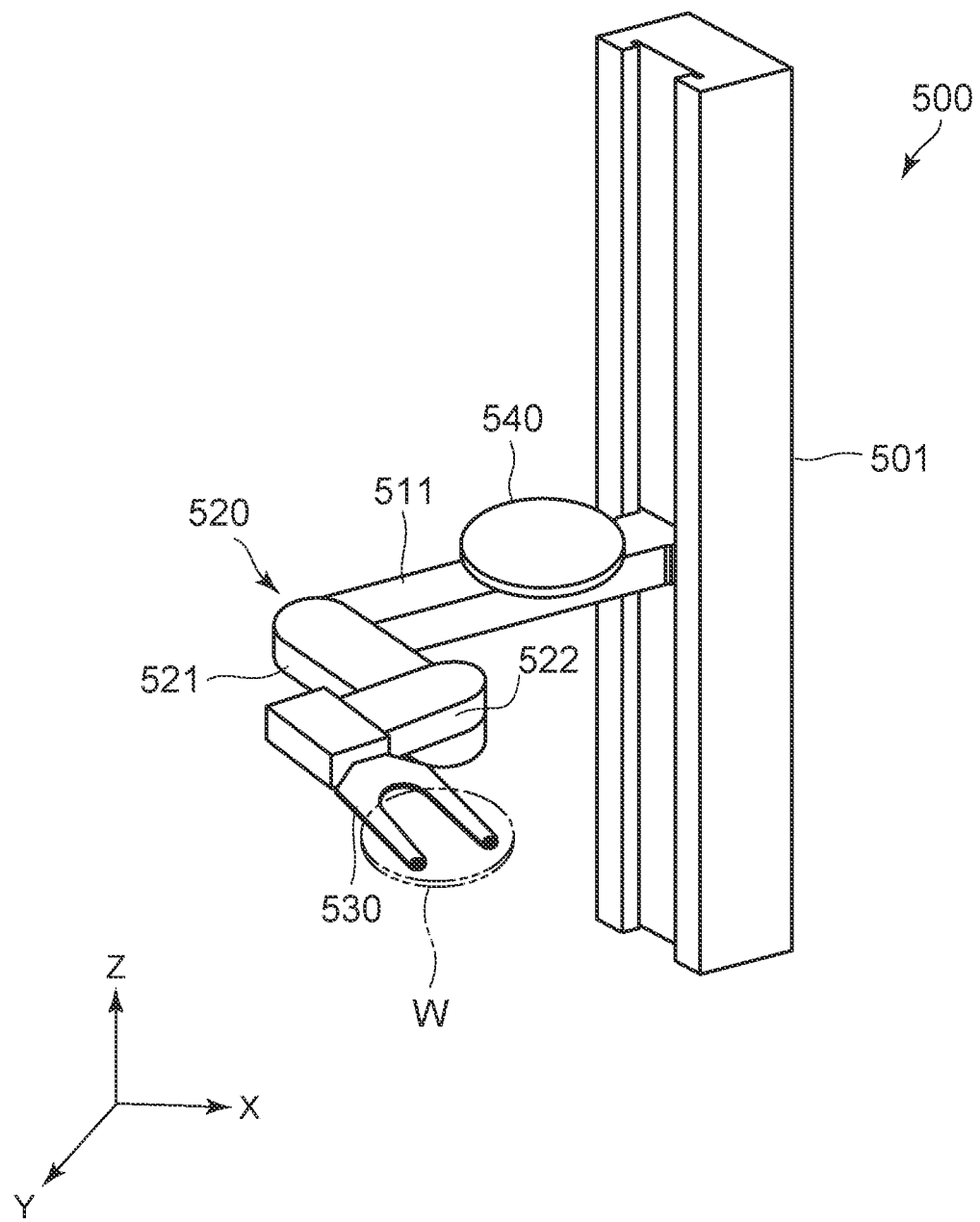
FIG. 9 is a diagram illustrating a perspective view of a substrate handling apparatus according to one or more embodiments.

FIG. 9 is a diagram illustrating a perspective view of a substrate handling apparatus 500 according to one or more embodiments. The substrate handling apparatus 500 of FIG. 9 illustrates a horizontal articulated clean robot, and in particular, illustrates a part of a clean robot whose elevating axis is a pillar type. The substrate handling apparatus 500 includes an elevating pillar 501, an elevating unit 511, and a hand unit including an arm 520 and a hand 530. The elevating pillar 501 supports the elevating unit 511 to be able to elevate and lower in the Z-axis direction illustrated in the figure. The elevating unit 511 is controlled to elevate and lower by a controller (not illustrated in the figure) that controls the substrate handling apparatus 500. The elevating pillar 501 may be fixed to a floor surface on which the substrate handling apparatus 500 is installed, or may be fixed to other semiconductor manufacturing equipment (not illustrated in the figure). The elevating unit 511 elevates and lowers the arm 520 along a groove provided in the elevating pillar 501 in the Z-axis direction illustrated in the figure. The arm 520 is rotatably attached to the elevating unit 511. The elevating pillar 501 of FIG. 9 has a structure in which a rectangular body has a groove for the elevating unit 511 to move, but it is not limited to thereto. For example, the structure may have a groove for the elevating unit 511 to move in a cylindrical shape.

The elevating unit 511 elevates and lowers to move in the vertical direction, and the arm 520 is movably mounted vertically. The arm 520 is rotatably attached to the elevating unit 511. The arm 520 may be a horizontally articulated arm. The arm 520 includes a first arm 521 and a second arm 522.

The first arm 521 is mounted between the elevating unit 511 and the second arm 522. A first end of the first arm 521 is rotatably attached to the elevating unit 511 in the XY-surface illustrated in the figure. A second end of the first arm 521 is attached to the second arm 522.

The second arm 522 is mounted between the first arm 521 and the hand 530. A first end of the second arm 522 is rotatably attached to the second end of the first arm 521 in the XY-surface illustrated in the figure. The hand 530 is attached to a second end of the second arm 522.

The hand 530 includes a wrist and a fork. The hand 530 is rotatably attached to the second end of the second arm 522 via the wrist in the XY-surface illustrated in the figure. The hand 530 obtains the substrate W from the FOUP (Front Opening Unified Pod) on which a plurality of wafers, etc. are mounted, using the fork. The hand 530 transports the obtained substrate W to a predetermined position in the substrate storage included in the manufacturing device.

The fork of the hand 530 illustrated in FIG. 9 may, for example, be an edge-grip type having a branching structure as illustrated in FIG. 5. Also, the hand 530 is not limited to the edge grip type, but may be a passive grip type or a suction type. The hand 530 supports the substrate W and transports the substrate W.

Each of the elevating unit 511, the first arm 521, the second arm 522, and the hand 530 is controlled in operation by a controller (not illustrated in the figure). Each of the elevating unit 511, the first arm 521, the second arm 522, and the hand 530 may be driven by an actuator (not illustrated in the figure). The actuator (not illustrated in the figure) may include, for example, an electric motor. At arm joints located between the elevating unit 511 and the first arm 521, between the first arm 521 and the second arm 522, and between the second arm 522 and the hand 530, an encoder (not illustrated in the figure) may be attached to detect rotational positions of each of the first arm 521, the second arm 522, and the hand 530. Also, the substrate handling apparatus 500 may be provided with an encoder (not illustrated in the figure) to detect a change in the position of the first arm 521 in the height direction, for example, the amount of elevation of the first arm 521 of the elevating unit 511. In this way, each joint of the arm 520 and the hand 530 is controlled to transport the substrate.

The substrate transport device 500 includes a disk 540. The disk 540 is provided above the elevating unit 511. Considering the handling of the arm 520 and the hand 530, the disk 540 may be provided at a predetermined interval from the rotation axis of the arm 520. The hand 530 takes out the substrate W and moves the substrate W to the upper part of the disk 540. For example, the hand 530, after taking out the substrate W, rotates and moves in the XY-surface illustrated in the figure, and moves substantially parallel to the top of the second arm 522. The second arm 522 rotates and moves in the XY-surface illustrated in the figure and moves substantially parallel to the top of the first arm 521. The first arm 521 rotates and moves in the XY-surface illustrated in the figure and moves substantially parallel to the top of the elevating unit 511. When the substrate W is moved onto the elevating unit 511, the disk 540 is placed so that the disk 540 is substantially below the substrate W in the Z-axis direction illustrated in the figure. The shape of the disk 540 illustrated in FIG. 9 is circular, but it is not limited thereto and can be implemented. The shape and dimensions of the disk 540 may be the same as in the aforementioned embodiments. Also, the substrate transport device 500 of FIG. 9 includes a two-link arm having two arms, but it is not limited thereto, and the number of arms may be one, three, four, or more. The disk 540 is provided on the elevating unit 511, but it is not limited thereto. The disk may be provided on the end of an arm to which the hand is not connected. In the case of multiple arms, the disk may be provided on an end of the arm connected to the hand and opposite the end connected to the hand in the longitudinal direction of the arm. In other words, in the case of multiple arms, the disk may be provided on the arm connected to the hand and on the end which is not connected to the hand.

Next, an operation of the substrate handling apparatus 500 is described. The substrate handling apparatus 500 may operate as illustrated in the flowchart of FIG. 4. That is, the substrate handling apparatus 500 first extracts the substrate W from the FOUP, etc. (step S101). The substrate W is extracted using a fork provided in the hand 530 of the substrate handling apparatus 500. Next, the extracted substrate W is transported onto the disk 540 provided in the substrate handling apparatus 500 (step S102). The disk 540 is provided in the elevating unit 511. The hand 530 from which the substrate W is extracted is rotated, and the substrate W is moved onto the disk 540 provided in the elevating unit 511 of the substrate handling apparatus 500. Next, the substrate W is imaged by a camera (not illustrated in the figure) (step S105). During the imaging, a light (not illustrated in the figure) provided on the disk 540 may be turned on to illuminate the substrate W. The light provided on the disk 540 and the camera may be the same as in the embodiments described above. Next, the position of the substrate W is calculated based on the captured image (step S107). To calculate the position of the substrate W, for example, the positions of a notch and an orientation flat of the substrate W are obtained from the captured image, and a correction amount of the substrate position is calculated based on the position and orientation of the substrate W relative to the position and orientation of the fork. For the measurement and correction of the misalignment of the substrate W, US Patent Publication 2021/0257242 is hereby incorporated by reference. Next, the substrate is placed on the manufacturing device for the next process based on the calculated correction amount (step S109).

Thus, according to the substrate handling apparatus 500 according to one or more embodiments, when obtaining an image of a substrate used for correcting a position of the substrate W, the substrate is transported onto a disk having a light that illuminates the substrate. Since the disk is provided on the arm of the substrate handling apparatus, the moving distance of the disk can be shortened, and the moving time of the disk can be reduced. In addition, since the imaging location is on the upper part of the arm, detection of the position and orientation of the substrate is improved. Furthermore, by providing the disk 540 on the elevating unit 511, an unexpected effect is obtained, which is that the amount of light viewed from the substrate W is stabilized.

FIG. 10 is a diagram illustrating a perspective view of a substrate handling apparatus 600 according to one or more embodiments. The substrate handling apparatus 600 of FIG. 10 illustrates a horizontal articulated clean robot, in particular, illustrates an elevating pillar 601 is a pillar type, and a part of a clean robot in which a hand 630 is directly connected to an elevating unit 611. The substrate handling apparatus 600 includes an elevating pillar 601, an elevating unit 611, and a hand 630. The elevating pillar 601 supports the elevating unit 611. The elevating unit 611 is controlled to elevate and lower by a controller (not illustrated in the figure) that controls the substrate handling apparatus 600. The elevating pillar 601 may be fixed to a floor surface on which the substrate handling apparatus 600 is installed, or may be fixed to other semiconductor manufacturing equipment (not illustrated in the figure). The elevating unit 611 elevates and lowers the hand 630 in the vertical direction (Z-axis direction) along a groove provided in the elevating pillar 601. The hand 630 is rotatably attached to the elevating unit 611 in the XY-surface illustrated in the figure. The elevating pillar 601 of FIG. 10 has a rectangular structure with a groove for the elevating unit 611 to move, but it is not limited thereto. For example, the structure may be a structure having a groove for the elevating unit 611 to move in a cylindrical shape.

The elevating unit 611 elevates and lowers to move in the vertical direction, and the hand 630 is mounted to be movable vertically. The hand 630 is rotatably attached to the elevating unit 611 in the XY-surface illustrated in the figure.

The hand 630 includes a wrist and a fork, and is rotatably mounted to the elevating unit 611 in the XY-surface illustrated in the figure via the wrist. The hand 630 obtains the substrate W from the FOUP (Front Opening Unified Pod) on which a plurality of wafers, etc. are mounted using the fork. Then, the hand 630 transports the obtained substrate W to a predetermined position in the substrate storage included in the manufacturing device.

The fork of the hand 630 illustrated in FIG. 10 may, for example, be an edge-grip type having a branching structure as illustrated in FIG. 5. Also, the hand 630 is not limited to the edge-grip type, but may be a passive grip type or a suction type. The hand 630 supports the substrate W and transports the substrate W.

Each of the elevating unit 611 and the hand 630 is controlled in operation by a controller. Also, each of the elevating unit 611 and the hand 630 may be driven by an actuator (not illustrated in the figure). The actuator (not illustrated in the figure) may include, for example, an electric motor. At an arm joint located between the elevating unit 611 and the hand 630, an encoder may be mounted to detect each rotational position of the hand 630. Also, in the substrate handling apparatus 600, an encoder (not illustrated in the figure) may be provided to detect a change in the position of the hand 630 in the height direction, for example, the amount of elevation of the hand 630 of the elevating unit 611. In this way, the joint of the hand 630 is controlled to transport the substrate.

The substrate handling apparatus 600 includes a disk 640. The disk 640 is provided on an upper part of the elevating unit 611. Considering the handling of the hand 630, the disk 640 may be provided at a predetermined interval from the hand rotation axis (not illustrated in the figure). The hand 630 takes out the substrate W and moves the substrate W to the upper part of the disk 640. For example, the hand 630, after taking out the substrate W, rotates and moves in the XY-surface illustrated in the figure, and moves substantially parallel to the top of the elevating unit 611. When the substrate W is moved onto the elevating unit 611, the disk 640 is positioned to be substantially below the substrate W in the Z-axis direction illustrated in the figure. The shape of the disk 640 illustrated in FIG. 10 is circular, but it is not limited thereto and can be implemented. The shape and dimensions of the disk 640 may be the same as in the aforementioned embodiments.

Next, an operation of the substrate handling apparatus 600 is described. The substrate handling apparatus 600 may operate as illustrated in the flowchart of FIG. 4. That is, the substrate handling apparatus 600 first extracts the substrate W from the FOUP, etc. (step S101). The substrate W is extracted using a fork provided in the hand 630 of the substrate handling apparatus 600. Next, the extracted substrate W is transported onto the disk 640 provided in the substrate handling apparatus 600 (step S102). The disk 640 is provided on the elevating unit 611. The hand 630 from which the substrate W is extracted is rotated, and the substrate W is transported onto the disk 640 provided on the elevating unit 611 of the substrate handling apparatus 600. Next, the substrate W is imaged by a camera (not illustrated in the figure) (step S105). During the imaging, a light (not illustrated in the figure) provided on the disk 640 may be turned on to illuminate the substrate W. The light provided on the disk 640 and the camera may be the same as in the embodiments described above. Next, the position of the substrate W is calculated based on the captured image (step S107). To calculate the position of the substrate W, for example, the positions of a notch and an orientation flat of the substrate W are obtained from the captured image, and a correction amount of the substrate position is calculated based on the position and orientation of the substrate W relative to the position and orientation of the fork. For the measurement and correction of the misalignment of the substrate W, US Patent Publication 2021/0257242 is referenced with support. Next, the substrate is placed on the manufacturing device for the next process based on the calculated correction amount (step S109).

Thus, according to the substrate handling apparatus 600 according to one or more embodiments, when obtaining an image of a substrate used for correcting the position of the substrate W, the substrate is transported onto a disk having a light that illuminates the substrate. Since the disk is provided on the substrate handling apparatus 600, the moving distance of the disk can be shortened, and the moving time of the disk can be reduced. In addition, since the imaging location is on the upper part of the arm, detection of the position and orientation of the substrate is improved. Furthermore, by providing the disk 640 on the elevating unit 611, an unexpected effect is obtained, which is that the amount of light viewed from the substrate W is stabilized. For examples of the structure and operation of the embodiment illustrated in FIG. 10, U.S. Pat. Nos. 8,746,631 and 10,083,851 are hereby incorporated by reference.

FIG. 11 is a diagram illustrating a perspective view of a substrate handling apparatus 700 according to one or more embodiments. The substrate handling apparatus 700 of FIG. 11 illustrates a horizontal articulated clean robot, in particular, illustrates a part of a clean robot, in which an elevating pillar 701 is a pillar type and a hand 730 is directly connected to a first elevating unit 711. The substrate handling apparatus 700 is similar to the substrate handling apparatus 600 illustrated in FIG. 10; however, the substrate handling apparatus 700 differs in that a disk 740 is held in a disk holder 712. The disk holder 712 is connected to a groove provided in the elevating pillar 701, and the disk 740 is provided at a predetermined interval from the elevating pillar 701. The disk holder 712 is provided at a lower position than the first elevating unit 711, but it is not limited thereto, and the disk holder 712 may be provided at a higher position than the first elevating unit 711. Also, the disk holder 712 is provided near the first elevating unit 711. The disk holder 712 may be elevated and lowered in the Z-axis direction illustrated in the figure as the first elevating unit 711 moves.

Each of the first elevating unit 711 and the hand 730 is controlled in operation by a controller (not illustrated in the figure). Also, each of the first elevating unit 711 and the hand 730 may be driven by an actuator (not illustrated in the figure). The actuator (not illustrated in the figure) may include, for example, an electric motor. At an arm joint located between the elevating unit 711 and the hand 730, an encoder may be attached to detect each rotational position of the hand 730. Also, in the substrate handling apparatus 700, an encoder may be provided to detect a positional change of the hand 730 in the height direction, for example, the amount of elevation of the hand 730 of the elevating unit 711. In this way, the joint of the hand 730 is controlled to transport the substrate. Also, the disk holder 712 may be fixed to the elevating pillar 701 and may be controlled in operation by a controller (not illustrated in the figure). Also, the disk holder 712 may be driven by an actuator (not illustrated in the figure). In addition, in the substrate handling apparatus 700, an encoder may be provided to detect a positional change of the disk holder 712 in the height direction, for example, the amount of elevation of the disk 740 of the disk holder 712.

The substrate handling apparatus 700 includes a disk 740. The disk 740 is provided on the disk holder 712. Considering a position of the substrate W held by the hand 730, the disk 740 may be provided. The hand 730 takes out the substrate W and moves the substrate W to the upper part of the disk 740. For example, the hand 730, after extracting the substrate W, rotates and moves in the XY-surface illustrated in the figure and moves the substrate W to the upper part of the disk 740 in the Z-axis. The elevating unit 711 moves in the Z-axis direction illustrated in the figure, e.g., downwardly, and moves the substrate W to substantially directly above the disk 740. Thereby, the disk 740 is positioned so that the disk 740 is substantially below the substrate W. The shape of the disk 740 illustrated in FIG. 11 is circular, but it is not limited thereto and can be implemented. The shape and dimensions of the disk 740 may be the same as in the aforementioned embodiment.

Next, an operation of the substrate transport device 700 is described. The substrate transport device 700 may operate as illustrated in the flowchart of FIG. 4. That is, the substrate transport device 700 first removes the substrate W from the FOUP, etc. (step S101). The substrate W is removed using a fork provided in the hand 730 of the substrate transport device 700. Next, the removed substrate W is transported onto the disk 740 provided in the substrate transport device 700 (step S102). The disk 740 is provided in the disk holder 712. The hand 730 from which the substrate W is removed is moved, and the substrate W is moved onto the disk 740 provided in the disk holder 712 of the substrate transport device 700. Here, when transporting the removed substrate W onto the disk 740 provided in the substrate transport device 700, the elevating unit 711 may move the substrate W above the disk holder 712, and the disk holder 712 may move the disk 740 below the substrate W. Next, the substrate W is imaged by a camera (not illustrated in the figure) (step S105). During the imaging, a light (not illustrated in the figure) provided on the disk 740 may be turned on to illuminate the substrate W. The light provided on the disk 740 and the camera may be the same as in the embodiments described above. Next, the position of the substrate W is calculated based on the captured image (step S107). To calculate the position of the substrate W, for example, the positions of a notch and an orientation flat of the substrate W are obtained from the captured image, and a correction amount of the substrate position is calculated based on the position and orientation of the substrate W relative to the position and orientation of the fork. The measurement and correction of the misalignment of the substrate W are disclosed in the US Patent Publication 2021/0257242, the entire contents of which are incorporated herein by reference. Next, the substrate is placed on the manufacturing device for the next process based on the calculated correction amount (step S109).

Thus, according to the substrate handling apparatus 700 according to one or more embodiments, when obtaining an image of a substrate used for correcting the position of the substrate W, the substrate is transported onto a disk 740 having a light to illuminate the substrate. Since the disk 740 is provided in the substrate handling apparatus 700, the moving distance of the disk can be shortened, and the moving time of the disk can be shortened. For examples of the structure and operation of the embodiment are disclosed in FIG. 11 of U.S. Pat. Nos. 8,746,631 and 10,083,851, the entire contents of which are incorporated herein by reference.

In a related art, a substrate was placed on a hand of a substrate handling apparatus and moved to a place where the substrate is imaged. In addition, it was necessary to place an aligner to adjust the orientation, etc. of the substrate near the substrate handling apparatus. As a result, the moving distance of the disk increased and the moving time of the disk increased, which affected the throughput. In addition, for example, when installing a dedicated station or aligner for imaging, an additional equipment was required, resulting in a floor plan limitation. Furthermore, the floor plan had to be designed considering the movement of an arm of the substrate handling apparatus.

According to a substrate handling apparatus according to one or more embodiments, a disk is provided in the substrate handling apparatus, and the substrate is imaged on the disk. As a result, the movement of the disk can be minimized. Therefore, since the moving time of the disk can be minimized, the throughput of the substrate transport can be improved. Also, the disk has a light that illuminates the substrate during imaging. Here, a camera is provided above the substrate, and the disk is provided below the substrate. In other words, the disk becomes a backlight during imaging, so that a clearer image of the substrate can be obtained.

Also, according to the substrate handling apparatus according to one or more embodiments, a correction amount relating to the position and orientation of the substrate is calculated, and the substrate is placed on the semiconductor manufacturing device in the next process based on the correction amount. In this case, the substrate is placed in a predetermined position and orientation by a placing operation based on the correction amount. Therefore, since there is no need to place an aligner in the substrate handling apparatus as in the related art, the degree of freedom in floor planning is improved.

One or more embodiments described above herein may be combined with one another to the extent feasible within the scope of the intended embodiments. The embodiments described above should be considered exemplary in all respects and not limiting. The illustrated and described embodiments may be extended to encompass other embodiments in addition to those specifically described without departing from the intended scope of the invention. The scope of the invention should be determined by the claims in light of the specification, including the equivalents, and not solely by the foregoing description. It is therefore intended that all configurations, including those included in the equivalent scope of the claims, are included in the invention. Accordingly, all configurations, including configurations included in the equivalent configurations of the claims, are intended to be included in the invention.

The invention claimed is:

1. A substrate handling apparatus comprising:
a base;
an elevating unit that is connected to the base to freely move up and down;
a hand unit comprising a hand and an arm having a first arm that is movably connected to the elevating unit and a second arm having a first end rotatably mounted to the first arm and a second end to which the hand is rotatably mounted, such that the hand unit obtains the substrate;
a camera positioned above the hand unit; and
a disk positioned above the first end of the second arm, the disk being where the hand unit moves a substrate, and onto which the substrate is to be placed such that the substrate is superimposed over the disk between the camera and the disk for imaging of the substrate by the camera from above the substrate, wherein
the disk comprises a light that illuminates the substrate for the imaging.

2. The substrate handling apparatus according to claim 1, wherein
the arm is rotatably connected to the elevating unit; and
the hand is movably connected to the arm and obtains the substrate.

3. The substrate handling apparatus according to claim 2, wherein
the disk is positioned on the arm.

4. The substrate handling apparatus according to claim 2, wherein
when the hand is positioned to overlap the arm, the disk is positioned under the substrate obtained by the hand.

5. The substrate handling apparatus according to claim 1, wherein
the disk is positioned on the base.

6. The substrate handling apparatus according to claim 1, wherein
the hand comprises a suction hand comprising a suction part.

7. The substrate handling apparatus according to claim 1, wherein
the disk comprises multiple lights that illuminate the substrate.

8. The substrate handling apparatus according to claim 7, wherein
the multiple lights are arranged on the entire surface of the disk.

9. The substrate handling apparatus according to claim 7, wherein
the multiple lights are arranged on the periphery of the disk.

10. The substrate handling apparatus according to claim 1, wherein
the light turns on to enable the disk to be imaged.

11. The substrate handling apparatus according to claim 1, wherein
the first arm is rotatably connected to the elevating unit.

12. A substrate transport method comprising:
extracting a substrate;
transporting the extracted substrate to be placed onto a disk;
illuminating the substrate placed on the disk for imaging;
imaging the entire substrate with a camera when the substrate is placed on the disk;
calculating a position of the substrate based on the captured image; and placing the substrate in a substrate storage based on the calculated correction amount.

13. The substrate transport method according to claim 12, wherein imaging the entire substrate comprises turning on a light for imaging the substrate, and imaging the entire substrate.

14. The substrate transport method according to claim 13, wherein imaging the entire substrate further comprises turning off the light after imaging the entire substrate is completed.

* * * * *